United States Patent [19]

Lerner

[11] 3,973,967

[45] Aug. 10, 1976

[54] PROCESSES UTILIZING PHOTOGRAPHIC ELEMENT CONTAINING A PHYSICAL DEVELOPMENT ACTIVATOR

[75] Inventor: Harry Lerner, Lexington, Mass.

[73] Assignee: Itek Corporation, Lexington, Mass.

[22] Filed: Aug. 19, 1974

[21] Appl. No.: 498,505

Related U.S. Application Data

[62] Division of Ser. No. 258,769, June 1, 1972, Pat. No. 3,862,843.

[52] U.S. Cl. .............................. 96/48 PD; 96/60 R; 96/66.4; 427/437; 427/304; 427/66
[51] Int. Cl.$^2$ ...................... G03C 5/24; G03C 5/20
[58] Field of Search ............... 96/76 R, 95.50 R, 88, 96/86, 107, 66.4, 66 R, 60 N, 60 R, 1.5, 33, 48 PD; 101/463; 427/437, 304

[56] References Cited

UNITED STATES PATENTS

| | | | |
|---|---|---|---|
| 3,157,502 | 11/1964 | Junker et al. | 96/60 R |
| 3,326,690 | 6/1967 | Muller-Bardorff et al. | 96/107 |
| 3,650,747 | 3/1972 | Calligaris et al. | 96/48 PD |
| 3,672,899 | 6/1972 | Archambault et al. | 96/107 |
| 3,690,886 | 9/1972 | van den Heuvel et al. | 96/48 PD |
| 3,700,447 | 10/1972 | Rarich et al. | 96/48 PD |
| 3,700,449 | 10/1972 | Lerner | 96/48 PD |

Primary Examiner—Won H. Louie, Jr.
Attorney, Agent, or Firm—Homer O. Blair; Robert L. Nathans; David E. Brook

[57] ABSTRACT

A physical developer activator material such as a material which reacts with the oxidized form of the reducing agent component of a physical developer is added to a photographic element comprising physical development nuclei or a photosensitive material capable of generating such nuclei. A preferred physical development activator material is an organic acid or a salt of an organic acid such as ammonium tartrate. This photographic element is utilized in a process comprising forming an image of physical development nuclei and then contacting the medium with a unitary physical developer comprising a solution of metal ions and a reducing agent for these metal ions. The photographic element of this invention is also utilized in a printing process comprising forming an image pattern of physical development nuclei in the photographic element, contacting the element with a unitary physical developer and then using the thus imaged element as a printing plate. The addition of the physical developer activator in the element used in this printing process improves the printing capability of the highlight dots or fine detail areas of the final printing plate. A preferred photographic element is one wherein the layer of physical development nuclei or photosensitive material capable of generating such nuclei as a thickness of less than about 2 microns. Preferred photosensitive materials useful in these processes are silver halide, titanium dioxide, zinc oxide, and tin oxide.

7 Claims, 2 Drawing Figures

PROCESSES UTILIZING PHOTOGRAPHIC ELEMENT CONTAINING A PHYSICAL DEVELOPMENT ACTIVATOR

CROSS REFERENCE TO RELATED APPLICATIONS

This is a division of application Ser. No. 258,769, filed June 1, 1972, now U.S. Pat. No. 3,862,843.

This application is related to copending applications U.S. Ser. Nos. 54,627 filed July 13, 1970, 55,238 filed July 13, 1970, and 174,102 filed Aug. 23, 1971, all in the names of Gracia et al. and to a U.S. patent application Ser. No. filed on even date herewith entitled Photographic Processes Utilizing Silver Halide Element Containing a Physical Development Initiator in the names of Archambault et al.

BACKGROUND OF THE INVENTION

This invention relates to the field of photographic media, physical development photography, and to various uses such as photograpic film, paper, and printing plates.

Photographic processes utilizing "physical developers" comprising a solution of metal ions and a reducing agent for these metal ions have been around for many years. In these processes an image pattern of physical development nuclei is formed such as by exposure of a photographic element comprising a photosensitive layer which upon exposure generates physical development nuclei. The photographic element containing the image pattern of physical development nuclei is then contacted with a physical developer to produce a metallic image in those areas where the physical development nuclei catalyze the selective deposition of metal.

Two types of physical development processes have achieved commercial success. The first is the diffusion transfer type of physical development which may more accurately be termed "solution physical development" wherein a solvent is added to the developer to thereby dissolve the silver halide in the unexposed portions of a silver halide copy medium thereby allowing the silver ions to be utilized for image formation on suitable physical development nuclei. These nuclei may be either in a separate layer on the same sheet as the silver halide layer or on a separate transfer sheet as is well known in the Polaroid process. A second physical development process which has achieved some commercial success is one wherein the metal ion solution is applied in a separate bath to the exposed photographic element and subsequently a reducing agent bath is applied to the element.

However, at the present time applicant is unaware of any commercial photographic processes utilizing a "unitary" physical developer comprising a solution of metal ions and a photographic reducing agent for these metal ions. A significant reason for this lack of commercial success with the unitary physical developer has been the lack of stability of this physical developer solution. A number of attempts have been made to overcome the instability of these physical developers by the addition of ionic surfactants, antifogging agents, and the like. See for example, U.S. Pat. Nos. 3,157,502 and 3,390,998, incorporated herein by reference. See also Jonker, et al. in Photographic Science and Engineering, vol. 13, 1969, pp. 38–44, also incorporated herein by reference, wherein a preferred unitary physical developer is discussed comprising a solution of ferrous ions, ferric ions, silver ions, a complexing agent such as citric acid, and an ionic surfactant as a stabilizing agent for the physical developer. By adjusting the concentration of the various components of this physical developer, relatively rapid rates of development have been achieved while maintaining a relatively stable physical developer. However, even with this preferred physical developer while the stability of the solution may be almost indefinite when sealed from the atmosphere and not in use, while being exposed to an oxidizing atmosphere such as air and during continual use this developer depending upon the concentration and activity, deteriorates within the matter of hours or at least a few days.

Two problems which are particularly critical in making printing plates by means of a unitary physical developer are (1) developer stability and (2) loss of fine detail or highlight portions of the printing plate. In the formation of printing plates it is particularly critical to have a physical developer which can deposit a large amount of metal compared to regular photographic applications such as film or paper. Thus, for example, for a useful printing plate it is necessary to deposit from about 0.1 – 20 grams of metal per square meter of printing plate to produce a useful plate wherein the image will accept ink and be able to undergo the abrasion of a printing press. A preferred physical developer for depositing this amount of metal and also the type of metal needed for achieving a long running printing plate is a unitary physical developer. Using this type of physical developer, a printing plate can be produced by contact with the developer for no more than 2 or 3 minutes. However, in order to achieve this type of physical developer it is necessary to utilize developers of such activity and concentration that the stability is lower than would be desired.

The problem of losing fine detail or highlight dot areas of the printing plate is particularly serious in trying to achieve high quality "halftone" or "continuous tone" printing plates using these physical development methods on aged photosensitive printing plates. These aged plates are ones which have been stored for a time period after manufacture. Thus, using a standard photographic test target, it is often impossible to obtain the 5% dots even in the 65 line screen areas. It is even more difficult to obtain these 5% dots in the 130 line screen areas. For high quality printing this type of loss makes the printing plate entirely unacceptable.

Applicant's invention overcomes these problems of the prior art by first in the case of the stability problem allowing applicant to utilize a unitary physical developer of lower activity or development rate which is inherently more stable than a developer of greater activity. Secondly, by utilizing applicant's invention it is now possible to produce printing plates having good fine detail and highlight dots such as shown in the 5% dot areas of a 65–130 line screen of an ordinary photographic test target. By utilizing an excess of physical development activator in the photographic element beyond what is needed to give good 5% dots in the 130 line screen area, it is possible to achieve the consistantly good results in the 5% dot areas which are necessary for a commercial printing plate for high quality printing. Additionally, 5% dot areas so produced wear well under the often severe abrasion and wear conditions of the printing press.

BRIEF SUMMARY OF INVENTION

A physical developer activator material is added to a photographic element comprising a layer of physical development nuclei or a photosensitive material capable of generating such nuclei. For purposes of this invention a "physical developer activator material" is defined as a material which increases the development rate of a unitary physical developer as defined herein. A preferred physical developer activator material is a material which reacts with the oxidized form of the reducing agent component of the physical developer so as to reduce its effective concentration. More preferably this material is an organic acid or a salt of an organic acid such as ammonium tartrate. This photographic element is utilized in a process comprising forming an image of physical development nuclei and then contacting the medium with a unitary physical developer comprising a solution of metal ions and a reducing agent for these metal ions. In one embodiment of the invention relating to super stable unitary physical developers, the physical developers are low activity developers preferably having a rate of development where no physical development activator is used of such that no useful image is produced after a 5 minute contact with the physical developer. A useful image for a printing is one which will print at least 1,000 prints on a standard lithographic press used under ordinary conditions. Typical of such a press is the Harris-Aurelia press using 50 lb. white offset stock using IPI black ink. For a photographic film transparency a useful image is one having an optical density of at least about 1. In another embodiment of the invention, the photographic element of this invention is utilized in a printing process comprising forming an image pattern of physical development nuclei in the photographic element, contacting the element with a unitary physical develper and then using the thus imaged element as a printing plate. The resulting printing plate has improved printing capability with respect to the highlight dots or fine detail areas of the printing plate. A preferred photographic element is one wherein the layer of physical development nuclei or photosensitive material capable of generating such nuclei has a thickness of less than about 2 microns. Preferred photosensitive materials useful in these processes are photoconductors such as silver halide, titanium dioxide, zinc oxide, and tin oxide.

DETAILED DESCRIPTION OF THIS INVENTION

Figure 1:
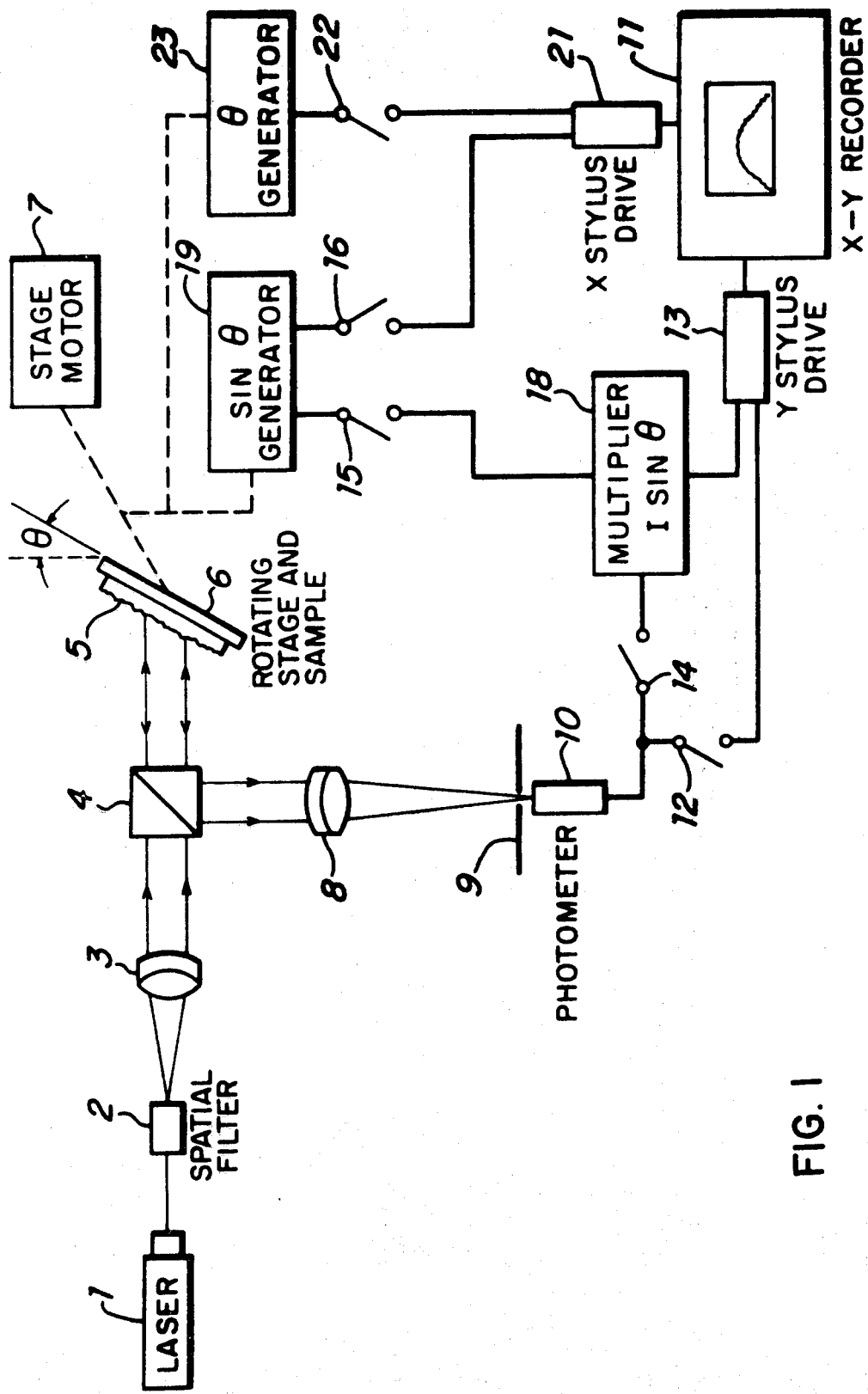
FIG. 1 illustrates in diagrammatic form the OSRM device used in this invention for characterizing the surface of various metal plate surfaces.

The "physical development activator material" of this invention increases the rate of selective metal deposition or optical density when contacting a unitary physical developer with a photographic element containing the physical developer activator material as compared with the same photographic element lacking this physical development activator material. Preferably, the amount and type of physical development activator material present in the element is such that the increase in the rate of metal deposition or optical density is at least about 30% based on weight of metal or optical density per unit areas per unit time and more preferably, at least about 100%. For use in processes for producing photographic films transparencies, optical densities is a more desirable indicator whereas for producing printing plates, the amount of metal deposition is the best indicator. In making this comparison of the rates of metal deposition, a standard development time of five minutes is utilized using the same developer in each case.

The physical developer activator material of this invention may be any material increases the rate of metal deposition other than the physical development nuclei. A preferred physical development activator material comprises a material which preferentially reacts with the oxidized form of the reducing agent component of the physical developer. This material is preferably a compound which complexes preferentially with the oxidized form of the reducing agent component of the physical developer. Such a complexing agent is an organic acid or a solvent soluble salt of an organic acid. Preferred organic acids are dicarboxylic acids such as maleic or malonic acids and hydroxy carboxylic acids such as salicylic, tartaric, lactic, and citric acids. Especially preferred are the hydroxy carboxylic acids and the soluble salts of these acids such as the alkali and alkaline earth metal, and ammonium salts of these acids. The ammonium salts of citric acid, tartaric acid, and lactic acid are especially preferred due to their especially good results. Other complexing agents suitable as physical development activator materials are complexing agents such as amino acids such as glycine, amines such as ethylenediamine, and $\beta$-diketones such as acetylacetone. The preferred physical development activator materials are ones which are compatible with the binder used in the photosensitive layer or layer of physical development nuclei and also a material which is not readily dissolved out of this layer during the processing.

Other materials which are suitable as physical development activator materials are materials which increase the pH and therefore, the activity of the developer; materials which are a source of metal ions; and a reducing agent for the metal ions of the unitary physical developer. In practice, it has been difficult to find a reducing agent which would have the shelf life stability necessary for normal use and the addition of metal ions to the layer of physical development nuclei or photosensitive material often causes fogging problems.

In many applications it is possible to include the physical development activator material in the layer of physical development nuclei or photosensitive material. However, it is also possible to divide the physical development activator material in a separate layer above or below the layer of physical development nuclei or photosensitive material. This is especially desired in those processes wherein the layer of physical development nuclei or photosensitive material has a thickness less than about 2 microns.

Additionally, it is generally necessary that the physical development activator material be in a solvent permeable binder such as is common in the photographic art. This binder serves the purpose of providing a reservoir for the physical development activator material which can be increased by increasing the thickness of the layer and also the physical development activator material will dissolve out of the layer during the period of contact of the photographic element with the physical developer.

The unitary physical developer utilized in this invention is defined to exclude the "two-step physical developer" and the "solvent type physical developer" mentioned above wherein stability of the developer is not a problem. The unitary physical developer comprises a solution of metal ions and a reducing agent for these metal ions and is capable of selectively depositing metal on a photographic media comprising a layer of physical developer nuclei, preferably which has been formed by exposure and if necessary further processing of a photosensitive layer. The physical developer of this invention does not require an externally applied electric charge as in electrolytic development.

Preferably the physical developers of this invention contain surfactants as stabilizers to minimize decomposition. The preferred surfactants are the ionic surfactants disclosed in U.S. Pat. No. 3,157,502.

The optimum results attainable with the physical developers is at pH values below 7, i.e. in acid media, usually at about pH 1.2 to 1.7. Lower pH values should be avoided because of the possible adverse effect on the surfactants which are sensitive to low pH values.

In the physical developers employed, the reducible metal ion is usually of a metal at least as noble as copper, e.g. silver, copper, gold, platinum, palladium and the like. However, other metal ions such as nickel and tin can also be used, with appropriate reducing agents. Reducing agents for copper, silver and like noble metal ions are readily determinable and are fully described in the literature.

A particularly effective unitary physical developer is composed of silver ions, as reducing agent therefor, the ferrous ions, ferric ions and preferably a material which preferentially forms a complex with the ferric ions of the developer such as an organic acid such as citric acid.

One of the primary advantages of utilizing the physical development activator in the photographic element of this invention is that a low activity physical developer may be utilized. This low activity developer is a unitary physical developer having exceptional stability because of this low activity. For example, an ordinary unitary physical developer when used constantly for several hours for developing printing plates comprising an exposed excess halide emulsion becomes completely depleted to the point that the developer must be completely replaced with fresh developer. This is true even when a developer replenisher system is used which replaces part of the spent developer with fresh developer as the developer is being used. Using the low activity developers of this invention, it is now possible to get developer stabilities greater than several hours when such developers are in constant use and yet still obtain sufficient metal deposition to form a useful printing plate or in the case of photographic film of producing an optical density of at least about 1. Thus a preferred low activity unitary physical developer for printing plates is one which when contacted with a plate containing an exposed silver halide layer in the absence of a physical developer activator for a period of up to about 5 minutes has a rate of metal deposition so low that it is not possible to produce a useful image for printing, i.e. printing at least 1,000 prints on an ordinary lithographic press under ordinary conditions. A preferred low activity unitary physical developer for photographic film is one which when contacted with a support coated with an exposed titanium dioxide-binder layer for up to about 5 minutes is incapable of producing an optical density of at least about 1.

This low activity physical developer is preferably one which has a rate of development of less than about 200 mg. of metal/m$^2$/min. when developing a photographic element consisting essentially of a silver latent image formed by exposing a photographic element comprising the silver halide layer of Example 1, except in the absence of a physical developer activator. It is even possible in this invention to utilize physical developers having such a low activity that the rate of development is substantially zero when contacted with a photographic element formed by exposure of a photographic element comprising silver halide and in the absence of a physical development activator material. The rate of metal deposition in this type of physical development is controlled by the $\Delta E$, concentration of metal ions, pH, temperature, and like factors known to the art. A preferred low activity physical developer is one having a $\Delta E$ of less than about 100 millivolts. For producing printing plates a developer having a $\Delta E$ between about 60 and about 100 millivolts is especially preferred because of the especially good printing results obtained. In the preferred physical developer system comprising a solution of silver ions, ferrous ions, ferric ions, and a complexing agent which preferentially complexes with the ferric ions, the $\Delta E$ is determined by varying the concentrations of these various components in relation to one another.

For the purpose of defining $\Delta E$, the unitary physical developer solution can be considered to be composed of two parts— namely, (1) a solution of a reducible metal ion ($Me^{+z}$), and (2) a solution containing all of the other components of the physical developer. The reversible potential of the metal, Me, immersed in a solution of part (1) vs. a reference electrode (e.g., saturated calomel electrode) can be called $E^r_{Me^{+z}_{Me}/Me}$. The potential of an inert metal electrode (e.g., Pt) immersed in a solution of part (2) vs. the same reference electrode can be called $E^r_{(2)}$. The value of $\Delta E$ is then given by the following expression:

$$\Delta E = E^r_{Me^{+z}_{Me}} - E^r_{(2)}$$

A preferred low activity physical developer is one having a rate of metal deposition less than that of a reference developer of the following composition:

| | | |
|---|---|---|
| 0.050 | mols/liter of ferrous sulfate | |
| 0.005 | mols/liter of ferric nitrate | |
| 0.14 | mols/liter of citric acid | |
| 0.006 | mols/liter of silver nitrate | |
| 0.02% | by weight of ionic surfactant (Armac 12D) | as a developer stabilizer. |
| 0.01% | by weight of non-ionic surfactant (Lissapol N) | |

The physical development nuclei of this invention is preferably a metal such as silver, gold, mercury, platinum, palladium, or the like. In silver halide photography, the latent silver image forms in the silver halide grain in the emulsion upon exposure and physical development is used to render the latent image visible. When a photosensitive material such as a metal oxide such as titanium dioxide, zinc oxide, or tin oxide are exposed and contacted with a solution of a reducible metal ion, a latent metal image is formed, visible or invisible, which can then be amplified by means of a unitary physical developer or it is possible to go directly into the unitary physical developer without first going into a metal ion bath.

The image of physical development nuclei can be 1. the image formed on photoexposure, e.g. the latent silver image in silver halide emulsions or the reversible latent image on a reversibly activatable photoconductor such as titanium dioxide;

2. the irreversible image formed by contacting an exposed photoconductor-bearing medium with a sensitizing metal ion, e.g. a solution of silver ion, which can lead to an invisible irreversible image or a visible metal image;

3. the latent ferrous ion image formed by photoexposure of a ferric salt-sensitized medium and then sensitized with silver ion solution to form a silver image; or 4. a conductive image or germ nuclei image produced by printing or by writing as taught in commonly owned copending U.S. Ser. No. 2,440, filed Jan. 12, 1970; by physically placing a metallic image adjacent to the support; by diffusion transfer of metal ions as taught in U.S. Pat. No. 3,300,306, by means of an imagewise exposed photopolymer layer over a germ nuclei layer, as for example in commonly owned copending application Ser. No. 697,948, filed Jan. 15, 1968, or the germ nuclei image formed by exposure of a prefogged photosensitive material such as lead iodide or $As_2S_3$ such as taught in Malinowski, "Photographic Science and Engineering," Vol. 15, No. 3, May–June incorporated herein by reference.

A preferred photosensitive material comprises a photoconductor such as silver halide or a photoconductor which becomes reversibly activated upon exposure to activating radiation and is capable of causing chemical reaction in the exposed areas. The photoconductor is preferably of a particulate nature, preferably incorporated in a solvent water permeable binder, and deposited as a very thin, removable layer upon the support, especially on a superficially roughened support, in such a way that the photoconductor is impregnated at least in part within the roughened portion of the support. This is readily accomplished for example by depositing a photoconductor, such as silver chloride, in a solvent-binder solution of relatively low viscosity and then coating this composition onto the roughened support. The coating composition may be allowed to dry. Such a support which has a photoconductor-binder coating will preferably have a very thin coating which is solvent permeable and will thereby allow rapid processing in the preferred developer systems.

It is also understood that a physically developable image can be produced by applying physical development or germ nuclei to the metallic support. This can be done by inscribing on the metallic support with, for example, a graphite pencil or may be done by applying a germ nuclei layer preferably in a binder and coated with a photo-impermeabilizable layer, then exposing to impermeablize the layer in exposed areas. Germ nuclei can be any material which will catalyze deposition of metal from the physical developer. Many such materials are known to the art, such as metal sulfide, finely divided metal particles, graphite and the like.

The preferred photosensitive media are those comprising silver halide as the photosensitive material. Such photosensitive media are more than adequately described in the literature and are well known to those in the art. Especially preferred silver halide media are those which contain a low content of silver halide in the photosensitive layer and especially those which have a stoichiometric excess halide ion based upon the amount of silver ion present in the photosensitive layer.

The preferred media of this invention are characterized by a layer of physical development nuclei or photosensitive material having a thickness of less than about 2 microns and preferably less than about 300 millimicrons. Most preferred layer thicknesses are less than about 100 millimicrons. The silver content of such layers is usually about 0.05 g/m$^2$ and may be as low as 0.01 g/m$^2$ in the most preferred layer thicknesses.

The so-called low silver content, thin photosensitive layer constitute a preferred form of the invention, particularly with metal substrates for the production of printing plates, electrical components, and the like. The silver halide employed is that which is conventionally used in photography and is made in the conventional way, i.e. by reaction in aqueous systems of soluble silver salt such as silver nitrate or sulfate and a soluble alkali metal halide, such as sodium chloride, sodium bromide or sodium iodide, or corresponding potassium salts. The formation of the particles of silver halide can be controlled to permit any desired particle size, ranging from as little as 30 to 50 Angstrom units up to conventional particle size. Preferred methods are those which encourage fine particle size, usually less than 0.5 microns. For general convenience, such fine particle size is obtained by using systems of high solids content, preferably at approximately 5% total solids (including the weight of silver halide and the binding agent) and rapidly mixing the soluble alkali metal halide solution with the soluble silver salt solution, usually at about room temperature, for convenience.

The binder employed for the physical development activator material and/or the layer of physical development nuclei or photosensitive material can be any of those solvent permeable materials conventionally used in forming silver halide or physical development photoconductor emulsions. Preferably, the binder should be wettable by aqueous solutions to a sufficient degree to permit rapid processing of the exposed layer. Preferred binders are the usual gelatin, so common in silver halide films, polyvinyl alcohol, polyacrylamide, polyvinylpyrollidone, poly(methylvinyl-ether)maleic anhydride), ethylene-maleic anhydride copolymer, polyacrylates, including polyacrylic acids, casein and the like. The use of polyvinyl alcohol is especially preferred where fine particle size silver halide is desired since the binder apparently discourages ripening, i.e. growth of the silver halide particles which occurs on standing.

In addition, other materials can be added to the layer of binder and physical development nuclei or photosensitive material as desired to obtain specific effects in this layer during or after exposure. For example, sensitizing dyes, thiourea, toners, mercuric salts or the like can be added for their known photographic effects, e.g. thiourea to assist in formation of black photographic images, and the sensitizing dyes to alter the spectral response of the photosensitive layer on photoexposure.

The photosensitive material can also be any of the literature, for example, U.S. Pat. Nos. 3,380,823, or 3,623,865, incorporated herein by reference. Generally the preferred photoconductors are silver halide or compounds of a metal with a non-metallic element of Periodic Group VI. Preferably, these photoconductors are metal oxides or sulfides, such as titanium dioxide, zinc oxide, zinc sulfide, cadmium sulfide, and cerium oxide, among others. Preferred oxides are titanium dioxide, zinc oxide, tin oxide and mixtures thereof.

The physical development nuclei or photosensitive material and the physical developer activator material in the selected binder are applied to the substrate using any of the art-recognized techniques, as by use of rollers, in the desired thickness. After drying the photographic media are ready for use. If desired a top coating can be applied to protect the photographic emulsion. Of course, the emulsion can also contain substances commonly employed with the specific photosensitive material, such as dye-sensitizers, sensitizing-metal salts, such as silver and copper salts, photographic reducing agents, and such materials commonly used in photographic emulsions.

The photoexposure step employed is the same as normally used for the selected photosensitive material. The photoprocessing of the exposed medium is also the same as normally employed.

The substrate for the present media include all of the substrates commonly employed such as paper, plastics and metal substrates. For example, cellulose acetate and polyethylene terephthalate can be used for transparent films while metals, such as aluminum and iron, as well as alloys thereof, can be used and are particularly adapted for photographically producing printing plates and printed electrical components, e.g. printed electrical circuits, capacitors, and the like, as well as nameplates and decorative metal plates. The preferred support for making long run printed plates are those on grained metal supports. Anodized aluminum supports give especially desirable results.

For the preferred metallic groups, any suitable metallic or substantially metallic backing of sufficient strength and durability to satisfactorily serve as a reproduction carrier can be employed. The support may be in any form such as, for example, sheets, ribbons, rolls, etc. This sheet may be made of any suitable metal or their alloys, as for example the hydrophilic metals such as chromium, nickel, lead, stainless steel, magnesium, or aluminum; or the oleophilic metals such as copper or zinc. Aluminum is preferred because of its desirable physical and chemical properties, as well as its economy. Aluminum as used herein is intended to include alloys of aluminum such as aluminum containing minor amounts of manganese, copper or magnesium. A porous anodized surface is especially preferred for the aluminum support. The anodized surface may be sealed by heating. However, the unsealed surface is preferred because of the improved adhesion that can be obtained between the metal image and the aluminum support. For long run printing plates an alloy such as Type 1100 aluminum is used which will resist cracking and will have the strength for these long runs.

The preferred metallic support may be of any suitable thickness. However, a thickness from about 0.006 to 0.025 inches is preferred for use as printing plates, and preferably for long run printing plates, the thickness is from about 0.012 to 0.015 inches.

The support and imaging metal may be chosen so as to give a good oleophilic-hydrophilic differentiation for use in a lithographic process. Also, by special treatments or the right substrate or imaging metal this process can be used to produce a plate useful in the so-called driographic manner described in U.S. Pat. No. 3,511,178, incorporated herein by reference.

Grained metallic supports are especially preferred for this invention. This support is capable of forming a bond with a metallic image formed by physical development thus forming a plate capable of being used as a printing plate and preferably as a long run printing plate and which upon testing with the Optical Surface Roughness Meter (OSRM), described below, produces a trace having a peak Height A between about 0.25 and about 0.90 at a Position B of between about 0.35 and about 0.80 and having a psi Value C of between about 0.40 and about 1.0. Such grains may be produced by physically graining, e.g. brush graining, ball graining or sand blasting or by chemical graining, e.g. acid or alkali etching. Chemical graining can be accomplished, for example, suitably by electrochemical treatment in an acid bath such as hydrochloric acid, nitric acid or a combination of nitric acid and acetic acid.

In a preferred embodiment a long run metallic based printing plates having run lengths comparable to the bimetallic plates are produced (run lengths in excess of 150,000 on a conventional lithographic press under ordinary conditions). For producing line copy, these plates are ones wherein the grain of the metallic, preferably aluminum, support as tested on the OSRM produces a trace having a peak Height A between about 0.50 and about 0.85 at a peak Position B of between about 0.60 and about 0.75 and having a psi Value C between about 0.65 and about 0.90. For producing half tones the trace produced has a peak Height A between about 0.75 and about 0.85 at a peak Position B of between about 0.70 and about 0.75 and having a psi Value C of between about 0.75 and about 0.90.

A "long run printing plate" as defined herein is an imaged printing plate which when placed upon a conventional lithographic offset high speed web press run under ordinary conditions such as a Harris Cottrell M-1000 at Colonial Press Inc., Clinton, Mass., which is a 24¾ × 36½ inch, 4 unit perfecting heat set web offset press running at about 26,000 impressions per hour, on 50 lb. white offset stock using IPI black ink, Dayco non-compressible blankets and Imperial fountain solution, will be capable of producing at least about 100,000 prints of good quality and preferably at least about 150,000 without any substantial loss of quality due to wear of the image or removal of the image from the printing plate.

When an imaged plate performs as a "printing plate" according to this invention, it is one which will produce at least about 5,000 prints on a conventional, lithographic offset press under ordinary conditions. Typical of such a press is the Harris-Aurelia press.

To measure the grain of the metallic supports utilized in this invention an Optical Surface Roughness Meter (OSRM) is used such as described in commonly owned copending application U.S. Ser. No. 168,938 filed Aug. 4, 1971, in the names of Peter Nisenson and Elliot Blackman, entitled Optical Device for Characterizing the Surface or Other Properties of a Sample, incorporated herein by reference.

The OSRM is useful for characterizing the surface topography of an opaque sample and for characterizing other properties of transparent samples. In the reflecting mode, a laser is useful to illuminate the surface of a rotating sample. Reflected laser light is focused at a pinhole aperture where its intensity is detected. Useful plots of the power spectrum of the reflected coherent light as a function of frequency are obtained which characterize the surface topography of the sample.

For characterizing surface topography of a reflecting surface, the OSRM uses a coherent light source, such as a laser, which provides a beam which is directed through a spatial filter, collimating objective and beam splitter onto the sample's surface. The sample is mounted on a rotating support. Surface irregularities modulate the reflected coherent beam which is passed back through the beam splitter and directed through a transforming objective to focus it at a pinhole aperture which has a phototube positioned behind it. The pinhole aperture is located in the back focal plane of the reflected light. Useful plots of the power spectrum of the reflected coherent light are obtained which characterize the surface topography of the sample.

Since the OSRM measures the coherent power spectra of diffracted light, it is also an advantage that known relationships have been established and are available between coherent power spectra and rough surface statistics. For example, see *The Scattering of Electromagnetic Waves from Rough Surfaces* by Peter Beckmann and Andre Spizzichino, Pergamon Press, London, 1963. A most important advantage is the exact categorization of surfce topographies that can be obtained relatively easily using devices as described herein. For example, the symmetry or directionality of the statistics of the surface topography can be easily determined with the new devices. This was impossible or at least very difficult with many of the prior art devices.

A most unique and important feature of the OSRM is that it produces a direct display of usable information. It is not necessary to manipulate the data obtained to have meaningful comparisons. In a preferred method of operation, plots can be directly obtained following an operator to display the surface's power spectra and such plots can be used for direct sample to sample comparisons. This is particularly important in quality control applications where the emphasis is often on testing samples quickly.

FIG. 1 is a diagrammatic illustration of the OSRM test device suitable for measuring coherent power spectra of reflected light from the surfaces of metal plates.

Following is a general description of the OSRM taken from the above mentioned commonly owned U.S. patent application: Laser 1 is used to provide a source of coherent light. Suitable lasers include helium-neon, argon, krypton, etc.

Laser 1 could be replaced by other sources of light which yield useful and self-consistent results. However, there are a limited range of conditions over which the results for different sources could be directly compared with one another and over which the analysis, given above under *Theory of the Invention*, is valid. These conditions are:

1. The source diameter must be smaller than the width of the scanning aperture — the aperture size is set by the desired spatial frequency bandwidth resolution. (The source size determines the "spatial coherence" of the source.)

2. The maximum wavelength (spectral) bandwidth of the source, $\Delta\lambda$, which determines the temporal coherence of the source, is given by the relation:

$$\Delta\lambda \leq \frac{\lambda \cdot \Delta\Theta}{2 \sin \Theta_{max}}$$

where:
$\lambda$ is the mean wavelength of the source
$\Delta\Theta$ is the angular width of the scanning aperture
$\Theta_{max}$ is the maximum angle of rotation by the sample.

Since the device described herein measures the coherent power spectrum of diffracted light, the light input must be at least partially coherent. In general, the amount of coherency required depends on the particular application. It is preferred to use light sources which emit moderately coherent light. Sources such as lasers which emit substantially coherent light are most preferred.

The laser beam is expanded and optical noise is removed by spatial filter 2 and collimated by collimating objective 3. A beam splitter 4 divides the beam into two parts, one of which is reflected and discarded. The other part is transmitted by beam splitter 4 to the surface of sample 5, an opaque sample whose surface roughness is to be characterized. A rotating stage 6 is used to support samle 5. Stage 6 is rotated around an axis through the plane of the sample's surface by stage motor 7.

The laser beam is diffracted by the surface of sample 5 and some portion of the diffracted coherent light is directed back toward beam splitter 4. As before, the reflected light is split into a reflected portion and a transmitted portion. This time, the transmitted portion is discarded and the reflected portion is directed through transforming objective 8 which focuses the reflected light at pinhole aperture 9. An intensity detector such as a photometer 10 is located directly behind pinhole aperture 9.

Pinhole aperture 9 is positioned at the back focal plane of the reflected light. Only reflected light which is backscattered from the surface of sample 5 in a direction anti-parallel to the illumination direction reaches photometer 10.

Because the sample 5 is rotating, the angle that the illuminating beam makes with the normal direction to the sample, $\Theta_I$, can vary from 0° to 90°. The light which reaches the photometer 10 is that component which has an angle of incidence of $\Theta_I$ and is scattered by the surface of sample 5 at an angle of $\Theta_D$ where $\Theta_I = -\Theta_D$.

The spatial frequency, $x_f$, of the component diffracted by an object where the incident field makes an angle $\Theta_I$ with the normal to the object and the component is diffracted at an angle $\Theta_D$ with the normal is given by $$x_f = \frac{\sin \Theta_I - \sin \Theta_D}{\lambda}.$$

Therefore, in this case the spatial frequency of the diffracted component is given by $$x_f = \frac{2 \sin \Theta}{\lambda}.$$

A variety of data, particularly in the form of plots, can be obtained from the apparatus shown. In one embodiment, a voltage signal proportional to the intensity sensed by photometer 10 can be used to drive the recording pen in the y direction on x-y recorder 11 by closing switch 12 thereby connecting it to y stylus drive 13 In another alternative output embodiment a voltage signal from photometer 10 is multiplied by the sin $\Theta$. This is accomplished by opening switch 12 and closing switches 14 and 15. Multiplier 18 then performs the desired multiplication of the signals from photometer 10 and sin Θ generator 19. The output signal from multiplier 18 is connected to stylus drive 13.

The x axis of x-y recorder 11 can be made representative of sin Θ or Θ. In the former embodiment, switch 16 is closed to connect sin Θ generator 19 to x-stylus drive 21. In the latter, switch 16 is opened and switch 22 is closed to connect Θ generator 23 to x-stylus drive 21.

Thus, the y axis of the x-y recorder 11 can be made to represent either light intensity (I), or light intensity (I) multiplied by sin Θ. In like manner, the x axis of x-y recorder 11 may represent either Θ or sin Θ. Therefore, x-y recorder 11 can display directly plots representing: (I) v. Θ; (I) v. sin Θ; (I) x sin Θ v. Θ; or (I) x sin Θ v. sin Θ.

When the x axis of recorder 11 corresponds to sin Θ, its scale is inversely proportional to the size of the scatters on the test surface. A conventional term for inverse size is spatial frequency. Multiplication of intensity (I) by sin Θ on the Y axis is equivalent to integrating the scattered intensity over all azimuthal angles for a given scattering angle for an isotropic surface. This has the effect of emphasizing the high angle (high spatial frequency) scattering while deemphasizing the low spatial frequency region. When intensity (I) is represented directly on the Y axis, greater emphasis is placed on low spatial frequencies.

In all measurements, the photometer 10 is adjusted so that the measured value of reflection at normal incidence (Θ=0) gives a full-scale deflection on the chart recorder before introducing the sin Θ weight factor. This normalization removes the effect of differences in the reflectivity of various test surfaces, thereby allowing direct comparison or contrast between scans of most rough surfaces.

As described above, since an x-y recorder is used, the sample is rotated at a linear velocity. If, however, the linear drive mechanism is replaced by a drive which rotates the sample at a velocity proportional to the arc-sin of Θ, the x-y recorder can be similarly replaced by a recorder with a time base drive on the x axis. The arc-sin drive mechanism thereby caused the x axis to be proportional to sin Θ.

The coherent power spectrum of light reflected from the sample's surface is displayed in the back focal plane of the transforming objective 8. As sample 5 is rotated, its power spectrum translates across pinhole aperture 9. Thus, this device accomplishes a scanning of the power spectrum, i.e. pinhole aperture 9 scans a line cut through the power spectrum.

Figure 2:
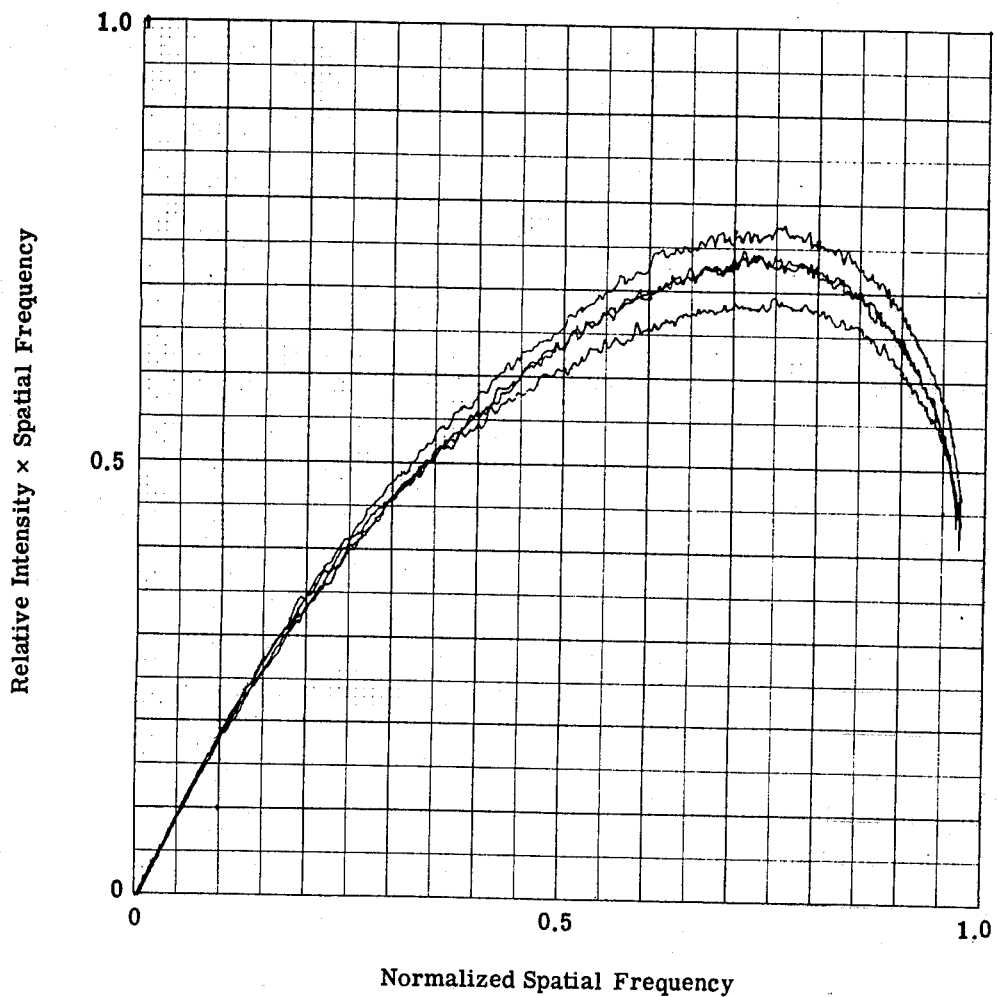
FIG. 2 shows an actual plot obtained using the Optical Scanning Roughness meter (OSRM) to characterize a metal plate surface.

The exact OSRM used to obtain plots such as illustrated in FIG. 2 describe the grain of the metal plates of this invention as follows:

A 1 milliwatt helium neon laser was used as a source. The beam was expanded and optical noise removed by a Gaertner spatial filer expander. A 2-inch focal length lens gave a collimated beam 1 cm. in diameter. The collimated beam of light was passed through a 1-inch cube beam splitter, which divided the light into two parts: one part was reflected and discarded, and the other part was transmitted by the beam splitter and illuminates the samples which were aluminum plates whose surfaces had undergone various treatments. The light was scattered by the surface and some of it was directed back toward the beam splitter. The reflected light from the sample's surface was split into two parts by the beam splitter: the transmitted portion was discarded and the reflected part passed through a 2-inch focal length lens which focused it at a pinhole aperture. Light that got to the phototube was only that which backscattered from the test plate in a direction antiparallel to the illumination direction. The test samples were mounted on a mechanism which rotated them around an axis passing through the plane of the sample's surfaces, so that the angle the illuminating beam made with the normal direction (or perpendicular) to the plate, Θ, varied from 0° to 90°. The velocity of rotation of the sample was set so that one trace (0° to 85°) took 15 seconds. The light getting back to the phototube was that component which was scattered by the surface at an angle Θ to the normal, so the actual scattered component due to the combination of the angularly offset illuminating beam and pick-up angle was at an angle of 2Θ to the normal direction. The output voltage from the phototube went through an amplifier and was multiplied by the voltage output of a sinusoidal potentiometer which was linked to the plate rotator. The result was plotted on an x-y plotter where the y axis corresponded to the light intensity (I) multiplied by sin (Θ), and the x axis was driven by a voltage taken directly from the sinusoidal potentiometer. Therefore, the recorder plotted (I) x sin (Θ) versus sin (Θ). This caused the x axis scale to be inversely proportional to the size of the scatterers on the sample's surfaces. The conventional term for inverse size is spatial frequency. Multiplication of the y axis by sin (Θ) was equivalent to integrating the scattered intensity over all asimuthal angles for a given scattering angle. This had the effect of emphasizing the high angle (high spatial frequency) scattering while de-emphasizing the low frequency region. In all measurements, the photometer was adjusted so that the measured value of the reflection at normal incidence (Θ=0) gave a full scale deflection (10 units) on the chart recorder (before introducing the sin (Θ) y-axis weighting factor). The x-axis scale was also set so that a 10-unit deflection would correspond to the optical cut-off frequency (when Θ=90°). This is called normalization and removed the effect of differences in various samples' reflectivity, allowing direct comparison between the scans of these samples.

As described in the copending application, the OSRM generates four traces to characterize the grain of the metallic support. The curves are more simply characterized using the following four parameters:

a. Peak Height A (vertical axis on a scale of zero to 1.0) of the highest of the four directional traces made on each surface, b. Peak Position B (horizontal axis on a scale of zero to 1.0) of the highest of these four directional traces made on each surface, c. Psi Value C which is used as a measure of the amount of fine structure in the surface, and is defined in the following way:
1. The peak Height A and the peak Position B is determined,
2. The height of the OSRM trace for the highest of the four curves is determined at the 0.90 position on the horizontal axis, and
3. The psi Value C is the ratio of the value obtained in (2) and the peak Height A., and d. The asymmetry—asymmetrical nature is numerically indicated as the value of the difference between peak Height A and the height of the lowest curve at position B on the horizontal axis.

The thickness of the layer of the physical development nuclei or photosensitive material capable of generating such nuclei, the insulating layer or subbing layer, where present, will depend upon the nature of the photosensitive material, the nature of the binder, where present, the amount of activating radiation utilized, and other like factors. However, in order to obtain an imaging medium capable of rapid processing it is preferred that the layer of physical development nuclei or photosensitive material be relatively thin, preferably less than about 2 microns and more preferably less than about 1 micron in thickness. However, the thickness of these layers may vary. For example, in the metal support embodiment the photosensitive coating or coating of physical development nuclei may be scraped off except for the portions which are immersed in the roughened surface. This coating thickness may be varied according to the effects desired. However, most preferable is a substrate wherein this coating is less than 1 micron in thickness in order to obtain coherent metal images which are adherently bonded to the support by the rapid processing which is most desired.

In one preferred embodiment an internal diffusion transfer plate is prepared by coating a layer of physical development nuclei such as Carey Lee Silver on a support to a dry thickness of less than about 2 microns in thickness. This layer is in turn coated with a layer of silver halide capable of being exposed and developed in a manner such as disclosed in U.S. Pat. No. 3,615,437, incorporated herein by reference, except that the physical developer activator material of this invention is incorporated in the plate. Preferably, the image produced by solution physical development is then amplified by means of the stabilized unitary physical developer of this invention instead of the electroplating baths of U.S. Pat. No. 3,615,437.

When used, the amount of binder to amount of physical development nuclei or photosensitive material may vary over wide ranges. Preferably, from about weight ratios of nuclei or photosensitive material to binder of 1 to 6 through 6 to 1 and more preferably from 1 to 1 through 1 to 3.

Irradiation sources which are useful in this invention for producing the initial latent image include any of the usual irradiation means commonly used with the selected photosensitive material. Thus actinic light, X-rays, or gamma rays are effective when photoconductors are used. Beams of electrons and other like particles may also be used in the place of the ordinary forms of electromagnetic radiation for forming an image. These various activating means are designated by the term "activating radiation."

Also, in the preferred silver halide emulsion containing an excess of halide ions and wherein a stabilized physical developer is utilized for development, it may be desirable to incorporate a sulfur compound as a development initiator. A preferred compound is a thiuram such as tetramethylthiuramdisulfide. This physical development initiator acts to improve the quality of the metal deposit formed when physical developing an exposed silver halide plate.

Additionally, in a preferred embodiment of this invention wherein it is desired to form a metal printing plate, it has been found desirable to add a layer of ionic surfactants such as disclosed in U.S. Pat. No. 3,157,502 such as Armac 12D (ionic surfactant) and Synthrapol N (non-ionic surfactant) to the photographic element. The surfactants may also be added to the layer of physical development activator or layer of photosensitive material or physical development nuclei. It has been found that the presence of the ionic surfactant in the photographic element results in metallic images of improved printing capability significantly improving both print quality and run length of the printing plate, especially when the low activity unitary physical developers are utilized to form the metallic image of the plate.

EXAMPLE 1

A 5% solution of polyvinyl alcohol (PVOH) is prepared by slowly adding PVOH resin powder to distilled water at room temperature with rapid stirring. The temperature is slowly raised to 95°C while maintaining rapid agitation, and held at 95°C for about 0.5 hour.

The following solutions are prepared using the 5% PVOH solution thus prepared (percentages and straight numbers are by weight):

| Solution A | | Solution B | |
|---|---|---|---|
| Distilled $H_2O$ | 326.0 | Distilled $H_2O$ | 456.0 |
| 10% aqueous NaCl | 92.7 | 10% aqueous $AgNO_3$ | 244.5 |
| 5% PVOH | 414.0 | | |

(Solution B is not prepared until immediately before the described use, i.e. freshly prepared before mixing with other solutions.) Solution A is agitated at room temperature with a high speed mixer for about 4 minutes. Solution B is then added and agitation is continued for 5 minutes. Subsequently, the mixture is filtered through a 5 micron bag to obtain an emulsion of the following characteristics:

Emulsion Constants

1:1 (parts by weight) silver chloride to PVOH
10% excess chloride
3.5% total solids
13.5 g. silver chloride/liter
pH = 5.2 to 5.4
viscosity = 4 – 5 cps.
59 mg. ammonium citrate per gram of silver chloride
1 mg. T-M The emulsion is then coated on grained aluminum supports either air knife, roller coating or similar coating means. Good results are obtained using a roller coater with hard rubber rolls. With proper settings, a coating weight of 0.05 g./m² can readily be obtained. The supports have been grained electrochemically or by brush graining.

The grained aluminum supports are aluminum supports having a thickness of about 0.012 inch and which have been electrochemically grained and anodized to give a grain defined on the OSRM as follows: Peak Height A — 0.93; Peak Position B — 0.73; Psi Value C — 0.88; and Asymmetry of 0.03.

A plate thus coated is then topcoated (wet coating thickness = 3 mils) with a solution of the following composition:

t-butylamine tartrate — 20%
PVOH (Gelvatol 40–20) — 15%

After drying, the plates are exposed imagewise to a 250 watt quartz-iodine lamp at a distance of 30 inches for 30 seconds. The plates are developed with a zero potential developer having the the composition:

Fe $(ClO_4)_2$ — 0.1 M
Fe $(NO_3)_3$ — 0.06 M

AgNO$_3$ — 0.09 M

Dark, black adherent images are obtained which accept ink. Such an inked plate can be put on a press and give copies.

EXAMPLE 2

A plate is coated with a silver halide emulsion as in Example 1 and then topcoated (wet coating thickness = 3 mils) with a solution of the following composition:

Ammonium tartrate — 4%
PVOH (Gelvatol 40-20) — 15%

After drying, the plates are exposed to a 250 watt quartz-iodine lamp at a distance of 30 inches for 30 seconds. The plates are then developed for 120 seconds in a 53 millivolt developer of the following composition:

| | |
|---|---|
| Fe (NH$_4$)$_2$ (SO$_4$)$_2$ | 0.105 M |
| Fe (NO$_3$)$_3$ | 0.095 M |
| Tartaric Acid | 0.053 M |
| AgNO$_3$ | 0.068 M |
| Ionic surfactant (Armac 12D) | 0.011% |
| Non-ionic surfactant (Synthropol N) | 0.011% |

Dark, black, adherent images are obtained. These images accept ink and are used on a press to give copies.

EXAMPLES 3 AND 4

Examples 1 and 2 are repeated except that the topcoating of the complexing agent is omitted. No images are obtained after exposure and development according to the procedures of Examples 1 and 2 respectively.

EXAMPLES 5 – 11

Examples 5 and 6 illustrate a zero potential unitary, stabilized physical developer. Example 5 shows that with the complexing agent ammonium tartrate absent from the emulsion no image formation takes place.

Examples 7 and 8 illustrate a low $\Delta E$ physical developer. Again, 8 shows that with the complexing agent absent from the emulsion no development takes place.

Example 9 illustrates the use of a low $\Delta E$ developer with a paper substrate.

Examples 10 and 11 show the same type of results as 7 and 8. Additionally, they show that this system can give good results for relatively short development times (i.e., 5 sec.).

Emulsions of the compositions given in Table 1 are exposed to activating radiation and developed using the stabilized unitary physical developers of Table 2 in accordance with the procedures of Table 3 to give the results indicated in Table 3.

TABLE 1

COMPOSITION OF AQUEOUS EMULSIONS USED TO COAT* A FILM AND PAPER
Emulsion Composition, % by weight

| Example Number | 5 | 6 | 7 | 8 | 9 | 10 | 11 |
|---|---|---|---|---|---|---|---|
| Component | | | | | | | |
| Titanium Dioxide | 8.7 | 8.7 | 8.0 | 8.0 | 8.0 | 3.9 | 3.9 |
| Ammonium Tartrate | 4.4 | | 4.0 | | 4.0 | 3.9 | |
| Polyvinyl alcohol (Elvanol 71-30) | | | 2.0 | 2.0 | 2.0 | 1.0 | 1.0 |
| Polyvinyl alcohol Gelvatol 40-20 | | | 2.0 | 2.0 | 2.0 | 1.0 | 1.0 |
| Polyvinylpyrrolidone (PVP K-90) | | | 0.8 | 0.8 | 0.8 | 0.2 | 0.2 |
| Polyacrylamide (Cyanomer A-370) | 1.3 | 1.3 | | | | | |
| Dispersant (Triton X-100) | 0.03 | 0.03 | 0.01 | 0.01 | 0.01 | 0.008 | 0.008 |
| Dispersant (Ekaline G-80 | 0.009 | 0.009 | | | | | |
| Substrate | | | | | | | |
| Subbed Triacetate film | x | x | x | x | | x | x |
| Single Weight Boryta paper | | | | | x | | |

*Emulsions 7, 8, and 9 were machine coated. Emulsions 5, 6, 10, and 11 were hand coated with a Gardner coater. In addition, 5 and 6 were topcoated with a 30% solution of Gelvatol 40-20.

TABLE 2

COMPOSITION AND $\Delta E$ OF PHYSICAL DEVELOPERS

| Number | Fe(ClO$_4$)$_2$, moles/liter (M/l) | Fe(NH$_4$)$_2$(SO$_4$)$_2$, M/l | Fe(NO$_3$)$_3$, M/l | Tartaric Acid, M/l | Silver Nitrate, M/l | ionic surfactant (Armac 12D), % by weight | non-ionic surfactant M/l (synthrapol N), % by weight | $\Delta E$, |
|---|---|---|---|---|---|---|---|---|
| 1 | 0.300 | | 0.030 | | 0.018 | | | 0 |
| 2 | | 0.105 | 0.105 | 0.053 | 0.068 | 0.011 | 0.011 | 46 |
| 3 | | 0.109 | 0.072 | 0.054 | 0.035 | 0.011 | 0.011 | 56 |

TABLE 3

EXAMPLES OF PROCESSING SCHEDULES AND SENSITOMETRIC RESULTS OBTAINED WITH EMULSIONS OF TABLE 1 AND DEVELOPERS OF TABLE 2

| | Sensitization | | Development | | Speed[b] | | Maximum | Base & Fog |
|---|---|---|---|---|---|---|---|---|
| Example[a] | (AgNO$_3$), M/l | Time, sec. | Developer | Time, sec. | at 0.2 | Gamma | Optical Density | Optical Density |
| 5 | 0.5 | 10 | 1 | 60 | 0.0096 | 1.1 | 1.56[c] | 0.16[c] |
| 6 | 0.5 | 10 | 1 | 60 | e | e | 0.14[c] | 0.14[c] |
| 7 | 0.05 | 15 | 2 | 60 | 0.020 | 2.7 | 2.6[c] | 0.17[c] |
| 8 | 0.05 | 15 | 2 | 60 | e | e | 0.17[c] | 0.11[c] |

TABLE 3-continued
EXAMPLES OF PROCESSING SCHEDULES AND SENSITOMETRIC RESULTS OBTAINED WITH EMULSIONS OF TABLE 1 AND DEVELOPERS OF TABLE 2

| Example[a] | Sensitization (AgNO$_3$), M/l | Time, sec. | Development Developer | Time, sec. | Speed[b] at 0.2 | Gamma | Maximum Optical Density | Base & Fog Optical Density |
|---|---|---|---|---|---|---|---|---|
| 9 | 0.1 | 5 | 3 | 60 | 0.036 | 1.15 | 1.18[d] | 0.08[d] |
| 10 | 0.1 | 15 | 3 | 5 | 0.0087 | 2.24 | 2.02[c] | 0.21[c] |
| 11 | 0.1 | 15 | 3 | 60 | e | e | 0.14[c] | 0.11[c] |

[a]All of the coatings were exposed on an E. G. & G. sensitometer for 10$^{-3}$ sec.
[b]Speed = 1/Log Energy (Meter-Candles-sec.) at 0.2 above base and fog
[c]Transmission optical density
[d]Reflection optical density
[e]Values were too small to be determined

EXAMPLE 12

Two emulsions were prepared as follows:

A first emulsion is prepared by dissolving 4 g. of gelatine in 40 ml. of H$_2$O (40°C). Add to this slowly and with stirring a dispersion of 0.1 g. of Argyrol (a commercial product for preparing colloidal silver). Then add, slowly, with stirring 50 ml. of H$_2$O containing 4 g. of ammonium tartrate.

A second emulsion is prepared according to the same procedure as the first emulsion except that the ammonium tartrate is omitted.

The above emulsions were applied to a subbed triacetate base, allowed to dry and then developed for 60 seconds in a 56 mv unitary physical developer of the composition of developer No. 3 of Examples 5–11. Silver was deposited on the emulsion containing the ammonium tartrate but not upon the other emulsion. Similar results are obtained when a negative resist image is first formed on top of the physical development nuclei layer as by coating the silver nuclei layer with a silver halide layer, drying and developing to a negative image. When developing with the above unitary physical developer a positive image is formed in the nuclei layer when a physical development activator material, ammonium tartrate, ammonium lactate, or ammonium citrate are present.

EXAMPLES 13 AND 14

Examples 1 and 3 are repeated except that a 1.5% solution of a hydroxyethyl cellulose (Gellosize QP-4400) is added to the zero potential developer in sufficient quantities to produce a highly viscous developer. Similar results are obtained as in Examples 1 and 3, i.e. when the physical development activator is present on the copy medium an image is produced upon development, but when this activator is not present no image is produced.

EXAMPLE 15

A copy medium comprising titanium dioxide and ammonium tartrate in a polyvinyl alcohol binder on a subbed triacetate film base is exposed for 10$^{-3}$ seconds on an E. G. & G. sensitometer, contacted with an aqueous solution of 0.1 M silver nitrate for 15 seconds and then contacted with a mercury physical developer of the following composition:

0.105 M Fe(NH$_4$)$_2$(SO$_4$)$_2$
0.095 M Fe(NO$_3$)$_3$
0.053 M Tartaric Acid
0.011% ionic surfactant (Armac 12D)
0.011% non-ionic surfactant (Synthrapol N)
0.05 M Hg(NO$_3$)$_2$ A dense black image is produced in the exposed portions of the copy medium having a D$_{max}$ of 2.9 and a gamma of 3.0.

When the above example is repeated except that the ammonium tartrate is omitted from the copy medium, no image is produced after contact with the mercury physical developer for the same period of time as previously.

EXAMPLES 16 – 18

An anodized aluminum substrate which has been grained and anodized as in Example 1 is coated by means of a roller coater with an emulsion having the following composition:

a) 0.6% NaCl  ⎫
b) 1.6% AgNO$_3$ ⎬ = 1.3% AgCl + 10% xs. Cl
c) 1.3% Lemol 16–98 ⎭
d) 0.013% Ammonium Citrate
e) 0.001% Thiuram When dried the emulsion has a thickness of about ⅓ micron. This thus coated aluminum plate is then topcoated by means of a Gardner coater with an ammonium tartrate-surfactant-binder material of the following composition:
  a. 2% Gelatin 2166
  b. 4% Ammonium Tartrate
  c. 0.08% ionic surfactant (Alamine 4)
     0.08% Acetic Acid
     0.08% non-ionic surfactant (Synthrapol N)
This topcoat has a wet thickness of about 3 mils.

This thus coated plate after drying is then exposed for 20 seconds to a quartz-iodide lamp at 30 inches. The exposed plate is then developed for 3 minutes in a 73 millivolt unitary stabilized physical developer of the following composition:
  0.103 M Fe(NH$_4$)$_2$(SO$_4$)$_2$
  0.068 M Fe(NO$_3$)$_3$
  0.052 M Tartaric Acid
  0.083 M AgNO$_3$
  0.010% ionic surfactant (Armac 12D)
  0.010% non-ionic surfactant (Synthrapol N)

A lustrous silver image is produced which is then rubbed up with a printing lacquer containing a mercaptan compound and an oleophilic resin which adheres selectively to the silver image areas and makes the plate ready to place on a printing press. The thus prepared printing plate is then placed on an ordinary offset lithographic press and used to print 100,000 copies.

The above example is repeated except that the ammonium tartrate is omitted from the top layer. No image is produced after similar exposure and development as described above.

The above procedure of Example 16 is repeated except that the ionic and non-ionic surfactants are omitted from the topcoat. Upon exposure and development as described above, a visible image is produced. However, this image is not suitable for a printing plate and when treated with a lithographic lacquer as above and placed on a printing press produces an entirely unacceptable print.

EXAMPLES 19 – 26

A 5% solution of polyvinyl alcohol (PVOH) is prepared by slowly adding PVOH resin powder to distilled water at room temperature with rapid stirring. The temperature is slowly raised to 95°C while maintaining rapid agitation, and held at 95°C for about 0.5 hour.

The following solutions are prepared using the 5% PVOH solution thus prepared (percentages and straight numbers are by weight):

| Solution A | | Solution B | |
|---|---|---|---|
| 10% NaCl | 92.7 | Distilled H$_2$O | 456.0 |
| | | 10% AgNO$_3$ | 244.5 |
| Solution C | | Solution D | |
| 5% Polyvinyl alcohol (Lemol 16–98) | 414.0 | 1% Thiuram | 2.06 |

Solutions A, B and C are heated to 30°C and solutions B and C are mixed together. The B/C mixture is then rapidly agitated with a high speed mixer and solution A slowly added over a period of 2 minutes. The A/B/C mixture is agitated for 3 minutes. Solution D is added and agitation is continued for 5 minutes.

Subsequently, the mixture is filtered through a five micron bag to obtain an emulsion, Emulsion No. 1, of the following characteristics:

Emulsion Constants

1:1 (parts by weight) silver chloride to PVOH
10% excess chloride
4.5% total solids
17.1 g. silver chloride/liter
1 mg. Thiuram
Viscosity — 6 cps.
pH — 5.7

A second emulsion, Emulsion No. 2, is prepared by mixing the following solutions by weight.

| Solution A | | Solution B | |
|---|---|---|---|
| Distilled water | 384.0 | Distilled water | 384.0 |
| 10% NaCl | 61.8 | 10% AgNO$_3$ | 163.0 |
| 5% polyvinyl alcohol (Lemol 16–98) | 412.0 | 5% Polyvinyl alcohol (Lemol 16–98) | 412.0 |
| Solution C | | | |
| 1% Thiuram | 1.40 | | |

(Solution B is not prepared until immediately before the described use, i.e. freshly prepared before mixing with other solutions.) Solution B is agitated at room temperature with a high speed mixer. Solution A is rapidly added to Solution B under rapid agitation. Agitation is continued for 3 minutes and Solution C is added. Agitation is continued for 5 minutes and the A/B/C mixture is filtered through a 5 micron bag to obtain an emulsion of the following characteristics:

Emulsion Constants

1:3 (parts by weight) silver chloride to PVOH
10% excess chloride
3.5% total solids
7.6 g. silver chloride/liter
1 mg. Thiuram Emulsions No. 1 and No. 2 were broken into 300 g. aliquots and the following salts added separately to each.
A. Sodium EDTA
B. Ammonium Citrate
C. Ammonium Tartrate The salts were added at concentrations of 0.166 grams and 1.33 grams by first dissolving in 10 cc of distilled water. Emulsions 1 and 2 containing none of the above A, B, or C salts formed the basis of two control emulsions.

The emulsions are then coated on grained aluminum supports either air knife, roller coating or similar coating means. Good results are obtained using a roller coater with hard rubber rolls. With proper settings, a coating weight of 0.05 g./m$^2$ can readily be obtained. The supports have been grained electrochemically or by brush graining.

The grained aluminum supports are aluminum supports having a thickness of about 0.012 inch and which have been electrochemically grained and anodized to give a grain defined as in Example 1.

The thus prepared plates are then exposed and processed as in Example 16. A definite tendency towards stronger image development was noted in all of the six plates containing the above mentioned additives as compared with the two control plates not containing these additives.

The thus prepared plates are then exposed and processed using a stabilized physical developer having a ΔE of about 127 which is prepared by first preparing solutions A/B/C as follows:

| Solution A | | Solution B | |
|---|---|---|---|
| Ferrous ammonium sulfate | 78.4 gms. | Non-ionic surfactant | |
| Ferric nitrate | 32.3 gms. | (Synthrapol N) | .8 |
| Citric acid | 80.0 gms. | Ionic surfactant (Alamine 4) | .8 |
| | | Acetic acid | .8 |
| Solution C | | | |
| 3 N. silver nitrate | | | |

Solutions A and B are then brought to 1 liter with distilled water. A mixture is then made of 125 cc of solution A, 25 cc of solution B and 6 cc of solution C.

All of the six plates containing the above-mentioned additive salts showed images of improved density or more lustrous images, particularly in the highlight dot areas, e.g. 5% dots on a 65–130 line screen as compared with the two control plates not containing these additives. This results in improved printing quality in the final print in these highlight dot areas when these plates containing the additives are used for printing as compared to the controls.

Three identical sets of six plates were prepared except that the plates were accelerated aged after preparation for 3 days, 2 weeks and 5 weeks, respectively. The results obtained are the same in these last three sets of plates as with the first, i.e. the plates containing the additives mentioned above show a definite tendency towards stronger images in the highlight dot areas.

EXAMPLE 27

A silver halide layer of the composition given in Example 16 is coated on an anodized aluminum substrate which has been grained and anodized as in Example 1. This thus prepared plate is then topcoated with a gelatin-ammonium lactate coating of the following composition:
2% by weight Gelatin 2166
2% by weight ammonium lactate
The topcoating has a wet thickness of 3 mils. The thus prepared plate is then exposed for 20 seconds to a 250 watt quartz-iodide lamp at 30 inches. The exposed plate is then developed for 3 minutes in a 73 millivolt unitary stabilized physical developer of the following composition:
0.105 M $Fe(NH_4)_2(SO_4)_2$
0.069 M $Fe(NO_3)_3$
0.068 M $AgNO_3$
0.08% ionic surfactant (Armac 4D)
0.08% acetic acid
0.08% non-ionic surfactant (Synthropol N)

The developed plate is then washed and rubbed down using conventional techniques for lithographic plates and then put on a standard lithographic printing press. Using conventional printing paper, the printing plate ran off in excess of 190,000 prints of good quality.

EXAMPLES 28 – 30

In order to indicate the advantage of the use of a low activity developer, three developers were made up of the following compositions:

56 millivolt developer

| | |
|---|---|
| $Fe(NH_4)_2(SO_4)_2$ | 0.109 Molar |
| $Fe(NO_3)_3$ | 0.072 Molar |
| Tartaric Acid | 0.054 Molar |
| Ionic surfactant (Armac 12D) | 0.011% |
| Non-ionic surfactant (Synthrapol N) | 0.011% |
| $AgNO_3$ | 0.035 Molar |

73 millivolt developer

| | |
|---|---|
| $Fe(NH_4)_2(SO_4)_2$ | 0.105 Molar |
| $Fe(NO_3)_3$ | 0.069 Molar |
| Tartaric Acid | 0.053 Molar |
| Ionic surfactant (Armac 12D) | 0.011% |
| Non-ionic surfactant (Synthrapol N) | 0.011% |
| $AgNO_3$ | 0.068 Molar |

121 millivolt developer

| | |
|---|---|
| $Fe(NH_4)_2(SO_4)_2$ | 0.105 Molar |
| $Fe(NO_3)_3$ | 0.032 Molar |
| Tartaric Acid | 0.053 Molar |
| Ionic surfactant (Armac 12D) | 0.011% |
| Non-ionic surfactant (Synthrapol N) | 0.011% |
| $AgNO_3$ | 0.068 Molar |

The developers were allowed to stand under identical conditions under normal ambient conditions exposed to the atmosphere. As a measure of the stability of the solution, the silver ion concentrations were measured at various time intervals.

| Time, Days | ($Ag^+$) concentration of developer | | |
|---|---|---|---|
| | 56 mV | 73 mV | 121 mV |
| 0 | 0.035 | 0.067 | 0.068 |
| 3 | 0.034 | 0.067 | 0.034 |
| 10 | 0.034 | 0.067 | 0.031 |
| 20 | 0.034 | 0.067 | 0.030 |
| 36 | 0.034 | 0.065 | 0.020 |

As can clearly be seen, the two developers having $\Delta E$s of 56 and 73 millivolts, respectively have hardly degraded at all at the end of the 36 days whereas the physical developer having a $\Delta E$ of 121 millivolts has significantly deteriorated after only 3 days.

Continual processing tends to degrade the three solutions much more rapidly than when the solutions are just standing. However, the stability of the two low $\Delta E$ developers is still significantly greater than the 121 millivolt developer.

I claim:

1. In a process for forming a metallic image on an element comprising a support having thereon a photosensitive material capable of generating physical development nuclei upon light exposure, said photosensitive material being contained in a layer of a first solvent permeable binder having a layer thickness of less than about 2 microns, said process comprises imagewise exposing said photosensitive material to light and subsequently physically developing said exposed photosensitive material with an aqueous physical developer having a $\Delta E$ of less than 100 millivolts and comprising a solution of silver ions, ferrous ions, ferric ions and an ionic surfactant, wherein the improvement comprises incorporating in said element a physical developer activator material comprising a complexing agent which preferentially forms complexes with the ferric ions in said physical developer, said activator material being contained in a layer of a second solvent permeable binder contiguous to said layer of a first solvent permeable binder and being present in sufficient amount to cause an increase in the rate of metal deposition or optical density of at least about 30% as compared with development of the element without developer activator therein when developed for the same period of time with said physical developer.

2. An improvement of claim 1 wherein said complexing agent is an organic acid or a salt of an organic acid.

3. A process of claim 2 wherein said photosensitive material is silver halide or a photoconductor which becomes reversibly activatable upon exposure to activating radiation.

4. An improvement of claim 3 wherein said complexing agent is a member selected from the group consisting of (1) dicarboxylic acids and solvent soluble salts of such acids, (2) hydroxy carboxylic acids and solvent soluble salts of such acids, (3) amino acids, (4) amines, and (5) $\beta$-diketones.

5. An improvement of claim 4 wherein said photosensitive material comprises titanium dioxide, zinc oxide, or silver halide.

6. An improvement of claim 1 wherein said complexing agent is selected from the group consisting of ammonium citrate, ammonium tartrate, t-butylamine tartrate, sodium hydrogen tartrate, sodium salicylate, sodium tartrate, calcium acetate, acetylacetone, sodium sulfate, triethanolamine, disodium EDTA, and ammonium lactate.

7. An improvement of claim 5 wherein said complexing agent is an ammonium salt of an acid selected from the group consisting of tartaric acid, citric acid and lactic acid.

* * * * *